US010951166B1

(12) United States Patent
Kruiskamp et al.

(10) Patent No.: US 10,951,166 B1
(45) Date of Patent: Mar. 16, 2021

(54) CRYSTAL OSCILLATOR WITH FAST START-UP

(71) Applicant: Dialog Semiconductor B.V., 's-Hertogenbosch (NL)

(72) Inventors: Marinus Wilhelmus Kruiskamp, 's-Hertogenbosch (NL); Bram Verhoef, Diepenheim (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/739,567

(22) Filed: Jan. 10, 2020

(51) Int. Cl.
*H03B 5/36* (2006.01)
(52) U.S. Cl.
CPC ....... *H03B 5/36* (2013.01); *H03B 2200/0012* (2013.01)
(58) Field of Classification Search
CPC .......................................................... H03B 5/36
USPC ...................................................... 331/116 R
See application file for complete search history.

(56) References Cited

U.S. PATENT DOCUMENTS

| 4,492,935 | A | 1/1985 | Fleischer |
| 4,941,156 | A | 7/1990 | Stern |
| 2005/0083139 | A1* | 4/2005 | Gazit ........................ H03B 5/06 331/158 |
| 2009/0261914 | A1* | 10/2009 | Kao ........................ H03B 5/366 331/158 |
| 2011/0037526 | A1 | 2/2011 | Kenichi |
| 2011/0241791 | A1* | 10/2011 | Hung ........................ H03B 5/36 331/158 |
| 2012/0098609 | A1 | 4/2012 | Verma |

OTHER PUBLICATIONS

"A 32MHz Crystal Oscillator with Fast Start-up Using Synchronized Signal Injection," by Bram Verhoef et al., ISSCC 2019, Session 18, Analog Techniques, 18.6, 2019 IEEE International Solid-State Circuits Conference, Feb. 17-21, 2019, pp. 304-306.
"A 54 MHz Crystal Oscillator with 30x Start-Up Time Reduction Using 2-Step Injection in 65nm CMOS," by Karim M. Megawer et al., ISSCC 2019, Session 18, Analog Techiniues 18.5, IEEE International Solid-State Circuits Conference, Feb. 17-21, 2019, pp. 302-304.
"Fast & Energy Efficient Start-Up of Crystal Oscillators by Self-Timed Energy Injection," by Joeri B. Lechevallier, IEEE Journal of Solid-State Circuits, vol. 54, No. 11, Nov. 2019, pp. 3107-3117.
U.S. Office Action, U.S. Appl. No. 16/739,552, Applicant: Marinus Wilhelmus Kruiskamp, dated May 21, 2020, 11 pages.
U.S. Office Action, U.S. Appl. No. 16/739,552, Applicant: Marinus Wilhelmus Kruiskamp, dated Sep. 24, 2020, 11 pages.

* cited by examiner

*Primary Examiner* — Joseph Chang
(74) *Attorney, Agent, or Firm* — Saile Ackerman LLC; Stephen B. Ackerman

(57) ABSTRACT

The present document relates to oscillator circuits and a method. An oscillator circuit generates an oscillating voltage signal, wherein the crystal has a first electrode and a second electrode. The oscillator circuit has a power source with a supply terminal and a reference terminal. The oscillator circuit has a switching circuit arranged between the power source and the crystal. The switching circuit, in a start-up phase, alternately connects the supply terminal of the power source to the first and second electrode of the crystal such that an amplitude of the oscillating voltage signal is increased.

24 Claims, 13 Drawing Sheets

CRYSTAL OSCILLATOR WITH FAST START-UP

TECHNICAL FIELD

The present document relates to oscillator circuits. More specifically, the present document relates to oscillator circuits based on quartz crystals for generating reference signals from which radio frequency (RF) signals compliant with the Bluetooth Low Energy (BLE) standard may be generated.

BACKGROUND

The Pierce oscillator is a frequently used electronic circuit that produces a periodic, oscillating signal. Typical application scenarios include RF applications or clock generators for generating clock signals in integrated circuits. The Pierce oscillator typically comprises an active element (such as an inverter), two capacitors, and a quartz crystal. However, there are still limitations and drawbacks of this frequently used oscillator architecture. For example, the two capacitors require a substantial amount of circuit area, the active element increases the overall power consumption of the oscillator, and the Pierce oscillator is sensitive towards parasitic capacitances over the quartz crystal.

Moreover, during start-up, the Pierce oscillator behaves like a linear circuit with the inverter acting as a transconductance, and it will start-up from noise. This takes a long time and is not very energy efficient. In particular, during start-up, the Pierce oscillator may consume a lot of energy relative to the energy that is eventually stored in the crystal. When Pierce oscillators are implemented in BLE circuits, the energy consumption related to start-up of the crystal oscillator may even be in the order of 10% of the total energy consumption.

SUMMARY

The present document addresses the above-mentioned technical problems. In particular, the present document addresses the technical problem of reducing the time and energy associated with the start-up of a crystal oscillator. Furthermore, the present document addresses the technical problem of providing a novel type of oscillator circuit which is smaller and has reduced power consumption compared to the conventional Pierce architecture.

According to an aspect, an oscillator circuit is presented. The oscillator circuit may comprise a crystal configured to generate an oscillating voltage signal, wherein said crystal comprises a first electrode and a second electrode. The oscillator circuit may comprise a power source comprising a supply terminal and a reference terminal. The oscillator circuit may further comprise a switching circuit arranged between the power source and the crystal. The switching circuit may be configured to, in a start-up phase, alternately connect the supply terminal of the power source to the first and second electrode of the crystal such that an amplitude of the oscillating voltage signal is increased. Further, the switching circuit may be configured to, in the start-up phase, connect the reference terminal of the power source to the second electrode when the supply terminal is connected to the first electrode, and to connect the reference terminal of the power source to the first electrode when the supply terminal is connected to the second electrode.

The crystal may comprise a piezo-electric material such as e.g. quartz. The switching circuit may comprise one or more switching elements. Each switching element may be implemented with any suitable device, such as, for example, a metal-oxide-semiconductor field effect transistor (MOSFET), or other suitable transistors. Each switching element may have a gate to which a respective driving voltage or control signal may be applied to turn the switching element on (i.e. to close the switching element) or to turn the switching element off (i.e. to open the switching element).

The switching circuit may be configured to, in the start-up phase, alternately connect the supply terminal of the power source to the first and second electrode of the crystal such that the oscillating voltage signal is temporarily increased when the oscillating voltage signal has a maximum voltage value or when the oscillating voltage signal is decreasing. Alternatively or additionally, the switching circuit may be configured to, in the start-up phase, alternately connect the supply terminal of the power source to the first and second electrode of the crystal such that the oscillating voltage signal is temporarily decreased when the oscillating voltage signal has a minimum voltage value or when the oscillating voltage signal is increasing.

The switching circuit may comprise a first supply switch coupled between the supply terminal of the power source and the first electrode of the crystal. The switching circuit may comprise a first ground switch coupled between the reference terminal of the power source and the first electrode of the crystal. The switching circuit may comprise a second supply switch coupled between the supply terminal of the power source and the second electrode of the crystal. The switching circuit may comprise a second ground switch coupled between the reference terminal of the power source and the second electrode of the crystal.

The oscillating voltage signal may be e.g. a sine wave voltage signal oscillating around an average voltage value which may be e.g. 0V. A maximum voltage value of the oscillating voltage signal may also be denoted as peak voltage, and a minimum voltage value of the oscillating voltage signal may also be denoted as valley voltage. The oscillator circuit may comprise an extreme voltage detection unit configured to detect a first time instance at which the oscillating voltage signal reaches a maximum voltage value, or a second time instance at which the oscillating voltage signal reaches a minimum voltage value. In yet other words, the an extreme voltage detection unit may be configured to detect a first time instance at which the oscillating voltage signal stops increasing and starts decreasing, and to detect a second time instance at which the oscillating voltage signal stops decreasing and starts increasing. In yet other words, the extreme voltage detection unit may determine a plurality of time instances when the oscillating voltage signal has a peak voltage, and the extreme voltage detection unit may determine a plurality of time instances when the oscillating voltage signal has a valley voltage.

Those skilled in the art will readily understand that the oscillating voltage signal may be associated with a corresponding oscillating current signal, wherein said oscillating current signal is shifted by approximately 90 degree with regards to the oscillating voltage signal. This phase shift may be caused by parasitic capacitances of the crystal, which may be primarily caused by the first and the second electrode of the crystal. Thus, as an alternative to the extreme voltage detection unit, the oscillator circuit may comprise a current zero-crossing detection unit configured to detect the first time instance at which a signal value of the oscillating current signal is equal to zero (and increasing), or the second time instance at which the signal value of the oscillating current signal is equal to zero (and decreasing).

That is, the current zero-crossing detection unit may be effectively configured to detect the same time instances as the extreme voltage detection unit described within this document.

The switching circuit may be configured to, at or after the first time instance, connect the supply terminal of the power source to the first electrode of the crystal (and connect the reference terminal of the power source to the second electrode of the crystal). Or, the switching circuit may be configured to, at or after the second time instance, connect the supply terminal of the power source to the second electrode of the crystal (and connect the reference terminal of the power source to the first electrode of the crystal).

For example, in the start-up phase, the switching circuit may be configured to, at or after the first time instance, close the first supply switch for connecting the supply terminal of the power source to the first electrode of the crystal. The switching circuit may be configured to, at or after the first time instance, close the second ground switch for connecting the reference terminal of the power source to the second electrode of the crystal. Likewise, the switching circuit may be configured to, at or after the second time instance, close the second supply switch for connecting the supply terminal of the power source to the second electrode of the crystal. The switching circuit may be configured to, at or after the second time instance, close the first ground switch for connecting the reference terminal of the power source to the first electrode of the crystal.

Still in the start-up phase, the switching circuit may be configured to, after connecting the supply terminal of the power source to the first electrode of the crystal and before the extreme voltage detection unit detects the second time instance, disconnect the supply terminal of the power source from the first electrode of the crystal. Or, the switching circuit may be configured to, after connecting the supply terminal of the power source to the second electrode of the crystal and before the extreme voltage detection unit detects the first time instance, disconnect the supply terminal of the power source from the second electrode of the crystal.

In other words, the switching circuit may be configured to connect the power source with the crystal only for a short period of time to create a short charging pulse. After this short charging pulse, the switching circuit may be configured to disconnect the power source from the crystal. In this way, the switching circuit may guarantee that the on-resistance of the switching circuit (e.g. the on-resistance of the first or second supply switch) does not influence the detection of the first or the second time instance by the extreme value determination unit.

The oscillator circuit may further comprise a load capacitor and a capacitive element. Both the load capacitor and the capacitive element may be disconnected from the crystal during the start-up phase. The switching circuit may be configured to, in a steady-state phase, couple the load capacitor to the crystal, and alternately connect and disconnect said capacitive element to and from the load capacitor such that the oscillating voltage signal continues oscillating with a given amplitude. In particular, the oscillator circuit may be configured to switch from the start-up phase to the steady-state phase after the amplitude of the oscillating voltage signal has reached a certain threshold amplitude. Alternatively, the oscillator circuit may be configured to switch from the start-up phase to the steady-state phase after a certain time limit.

The load capacitor may be coupled in parallel with the crystal. The switching circuit may be configured to connect the capacitive element in parallel with the load capacitor.

During the steady-state phase, the described oscillator circuit may be denoted as "switched capacitor oscillator" circuit since the capacitive element is repeatedly connected to and disconnected from the load capacitor. The capacitive element may be e.g. a capacitor. In general, the capacitive element may be a passive electronic component capable of storing electrical energy in an electric field. The capacitive element may comprise a first terminal and a second terminal. Unlike solutions known from the prior art, the proposed oscillator circuit may primarily comprise passive electronic components, and may not comprise active electronic components such as e.g. inverters or current sources. Compared to known solutions such as e.g. the Pierce oscillator, the presented switched capacitor oscillator shows the advantages of lower power consumption and smaller circuit area. Moreover, the proposed oscillator circuit is less sensitive with regards to parasitic capacitances of the crystal.

For example, the oscillator circuit may be used for generating an accurate, fixed reference frequency. From this reference frequency, signals in the RF range of about 100 kHz to 100 GHz may be generated using phase locked loops (PLL) or delay locked loops (DLL). More specifically, the oscillator circuit may be used to derive RF signals for radio communication standards such as e.g. the BLE standard. Another application of the proposed oscillator circuit is in real-time clocks. In general, the load capacitor (or alternatively the load capacitor and the capacitive element) may be selected to tune a resonance frequency of the oscillator circuit to a desired value depending on the application scenario.

The switching circuit may be configured to, after disconnecting the capacitive element from the load capacitor, connect the capacitive element to the power source for charging the capacitive element. The switching circuit may be configured to disconnect the capacitive element from the power source before connecting the capacitive element to the load capacitor.

More specifically, the oscillator circuit may be configured to, in the steady-state phase, charge the capacitive element and connect the capacitive element to the load capacitor such that the oscillating voltage signal is temporarily increased when the oscillating voltage signal has a maximum voltage value or when the oscillating voltage signal is decreasing. The oscillator circuit may be configured to, in the steady-state phase, charge the capacitive element and connect the capacitive element to the load capacitor such that the oscillating voltage signal is temporarily decreased when the oscillating voltage signal has a minimum voltage value or when the oscillating voltage signal is increasing.

The above-described extreme voltage detection unit may be used to determine the first and second time instance, wherein an output signal of the extreme voltage detection unit is used by the oscillator circuit both during the start-up phase and the steady-state phase. On the one hand, during the start-up phase, the power source is repeatedly connected, based on said output signal, to the crystal for adding energy to the oscillation. On the other hand, during the steady-state phase, the capacitive element is repeatedly connected, based on said output signal, to the crystal (and the load capacitor) for maintaining the oscillation and to compensate for losses within the crystal. To this end, the same or different extreme voltage detection units may be used during the start-up phase and the steady-state phase. To save circuit area, however, it may be beneficial to use a single extreme voltage detection unit for both the start-up phase and the steady-state phase.

For example, the extreme voltage detection unit may comprise a capacitor coupled either to the first electrode or the second electrode of the crystal, an inverting amplifier coupled between the capacitor and an output of the extreme voltage detection unit, and a resistor coupled in parallel to the inverting amplifier.

For example, the extreme voltage detection unit may comprise a multiplexer configured to receive a control signal and to connect, based on said control signal, either the first electrode or the second electrode of the crystal to the capacitor of the extreme voltage detection unit. The control signal may be e.g. derived from a signal used for controlling the second ground switch.

Moreover, the extreme voltage detection unit may comprise an auto-zero switch coupled in parallel to the inverting amplifier. The oscillator circuit may be configured to initialize the extreme voltage detection unit by closing the auto-zero switch for a period of time, and then open the auto-zero switch again. For instance, the oscillator circuit may be configured to initialize the extreme voltage detection unit shortly after the first or the second time stance has been detected by the extreme voltage detection unit.

In general, the extreme voltage detection unit may be configured to determine a differentiated signal by differentiating the oscillating voltage signal, and to detect a zero-crossing of the differentiated signal.

According to another aspect, a method of operating an oscillator circuit is described. The method may comprise steps which correspond to the features of the oscillator circuit described in the present document. Specifically, the oscillator circuit may comprise a crystal for generating an oscillating voltage signal, wherein said crystal comprises a first electrode and a second electrode. The oscillator circuit may comprise a power source comprising a supply terminal and a reference terminal. The oscillator circuit may comprise a switching circuit arranged between the power source and the crystal. The method may comprise, in a start-up phase, alternately connecting the supply terminal of the power source to the first and second electrode of the crystal such that an amplitude of the oscillating voltage signal is increased.

The method may comprise, in the start-up phase, by the switching circuit, alternately connecting the supply terminal of the power source to the first and second electrode of the crystal such that the oscillating voltage signal is temporarily increased when the oscillating voltage signal has a maximum voltage value or when the oscillating voltage signal is decreasing. The method may comprise, in the start-up phase, by the switching circuit, alternately connecting the supply terminal of the power source to the first and second electrode of the crystal such that the oscillating voltage signal is temporarily decreased when the oscillating voltage signal has a minimum voltage value or when the oscillating voltage signal is increasing.

The switching circuit may comprise a first supply switch coupled between the supply terminal of the power source and the first electrode of the crystal. The switching circuit may comprise a first ground switch coupled between the reference terminal of the power source and the first electrode of the crystal. The switching circuit may comprise a second supply switch coupled between the supply terminal of the power source and the second electrode of the crystal. The switching circuit may comprise a second ground switch coupled between the reference terminal of the power source and the second electrode of the crystal.

The method may comprise detecting, by an extreme voltage detection unit, a first time instance at which the oscillating voltage signal reaches a, maximum voltage value. Additionally or alternatively, the method may comprise detecting, by the extreme voltage detection unit, a second time instance at which the oscillating voltage signal reaches a minimum voltage value. The method may comprise connecting, at or after the first time instance, the supply terminal of the power source to the first electrode of the crystal. The method may comprise connecting, at or after the second time instance, the supply terminal of the power source to the second electrode of the crystal.

Further, the method may comprise disconnecting, after connecting the supply terminal of the power source to the first electrode of the crystal and before the extreme voltage detection unit detects the second time instance, the supply terminal of the power source from the first electrode of the crystal. The method may comprise disconnecting, after connecting the supply terminal of the power source to the second electrode of the crystal and before the extreme voltage detection unit detects the first time instance, the supply terminal of the power source from the second electrode of the crystal.

The oscillator circuit may comprise a load capacitor and a capacitive element. The method may comprise coupling, in a steady-state phase, the load capacitor to the crystal. The method may comprise alternately connecting and disconnecting, in the steady-state phase, said capacitive element to and from the load capacitor such that the oscillating voltage signal continues oscillating with a given amplitude.

The method may comprise, after disconnecting the capacitive element from the load capacitor, connecting the capacitive element to the power source for charging the capacitive element.

The method may comprise disconnecting the capacitive element from the power source before connecting the capacitive element to the load capacitor.

The method may comprise comprising charging, in the steady-state phase, the capacitive element and connecting the capacitive element to the load capacitor such that the oscillating voltage signal is temporarily increased when the oscillating voltage signal has a maximum voltage value or when the oscillating voltage signal is decreasing. Or, the method may comprise comprising charging, in the steady-state phase, the capacitive element and connecting the capacitive element to the load capacitor such that the oscillating voltage signal is temporarily decreased when the oscillating voltage signal has a minimum voltage value or when the oscillating voltage signal is increasing.

The extreme voltage detection unit may comprise a capacitor coupled either to the first electrode or the second electrode of the crystal. The extreme voltage detection unit may comprise an inverting amplifier coupled between the capacitor and an output of the extreme voltage detection unit. The extreme voltage detection unit may comprise a resistor coupled in parallel to the inverting amplifier. The extreme voltage detection unit may comprise an auto-zero switch coupled in parallel to the inverting amplifier. The method may comprise initializing the extreme voltage detection unit by closing the auto-zero switch for a period of time, and then opening the auto-zero switch again.

The method may comprise determining, by the extreme voltage detection unit, a differentiated signal by differentiating the oscillating voltage signal. The method may comprise detecting, by the extreme voltage detection unit, a zero-crossing of the differentiated signal.

According to a further aspect, a software program is described. The software program may be adapted for execution on a processor and for performing the method steps outlined in the present document when carried out by the processor.

According to another aspect, a storage medium is described. The storage medium may comprise a software program adapted for execution on a processor and for performing the method steps outlined in the present document when carried out by the processor.

According to a further aspect, a computer program product is described. The computer program product may comprise instructions for performing the method steps outlined in the present document when carried out by the processor.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple", "connect", "coupled" or "connected" refers to elements being in electrical communication with each other, whether directly connected e.g., via wires, or in some other manner.

BRIEF DESCRIPTION OF THE DRAWINGS

The present invention is illustrated by way of example, and not by way of limitation, in the figures of the accompanying drawings in which like reference numerals refer to similar or identical elements, and in which.

DESCRIPTION

Figure 1:
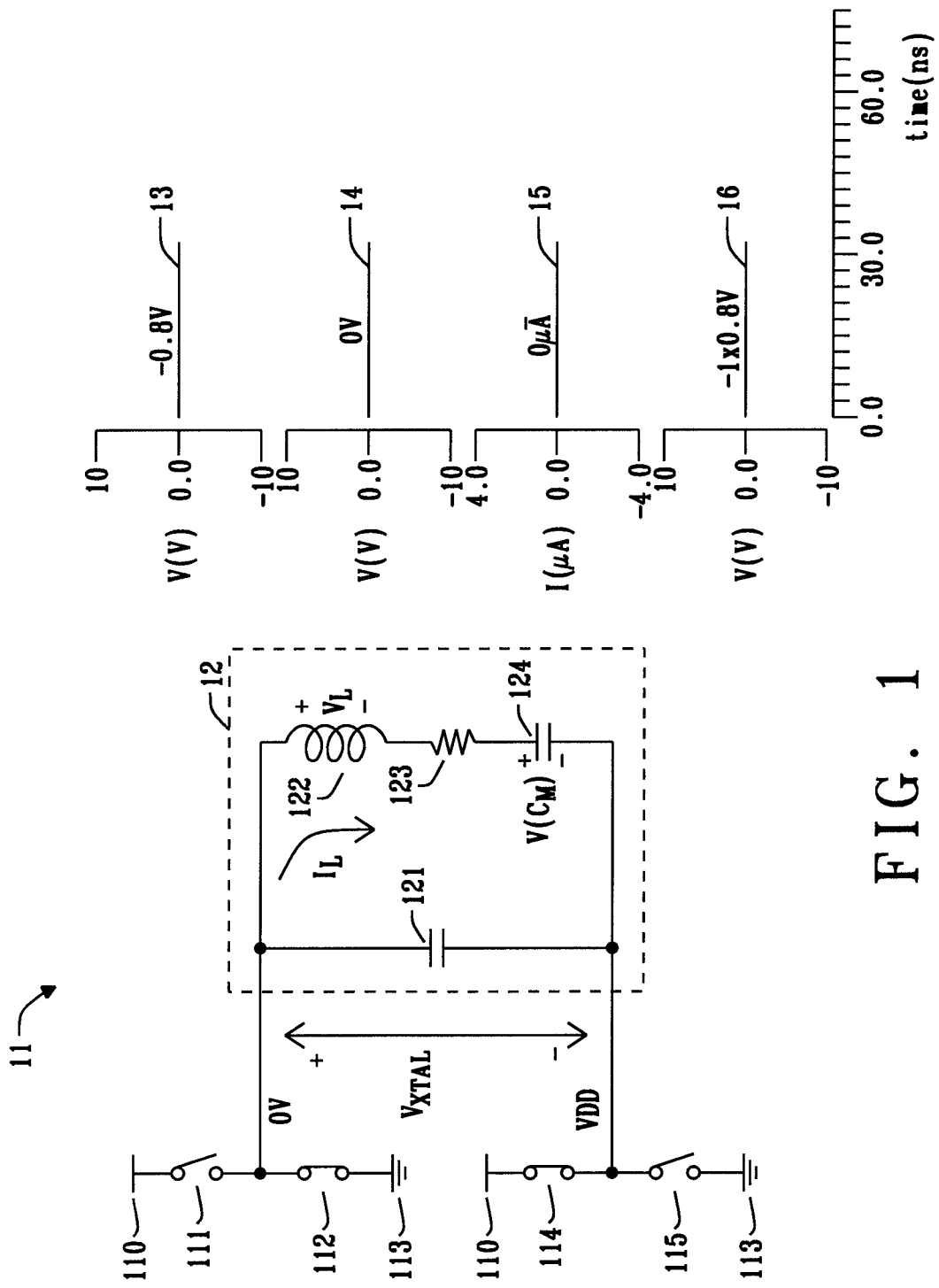
FIG. 1 shows an exemplary oscillator circuit and associated signals in an initial situation of the start-up phase.

FIG. 1 shows an exemplary oscillator circuit 11 and associated signals waveforms 13, 14, 15, 16 in an initial situation of the start-up phase. A crystal 12 is illustrated using an equivalent circuit diagram with a serial connection of an inductor 122, a resistor 123, and a capacitor 124 connected between the two electrodes of the crystal 12. In addition, a parasitic capacitor 121 is connected between the two electrodes of the crystal 12.

Moreover, the exemplary oscillator circuit 11 comprises a switching circuit with a first supply switch 111 coupled between a supply terminal 110 of a power source and the first electrode of the crystal 12. The switching circuit also comprises a first ground switch 112 coupled between the reference terminal 113 of the power source and the first electrode of the crystal. The switching circuit comprises a second supply switch 114 coupled between the supply terminal 110 of the power source and the second electrode of the crystal. The switching circuit comprises a second ground switch 115 coupled between the reference terminal 113 of the power source and the second electrode of the crystal.

In FIG. 1, an initial situation is displayed in which the first supply switch 111 and the second ground switch 115 are open, the first ground switch 112 and the second supply switch 114 are closed. There is no oscillation. Signal 13 illustrates the voltage $V_{XTAL}$ between the electrodes of the crystal 12. Signal 14 illustrates the voltage across the inductor 122. Signal 15 illustrates the current through the inductor 122. Signal 16 illustrates the voltage across capacitor 124.

Figure 2:
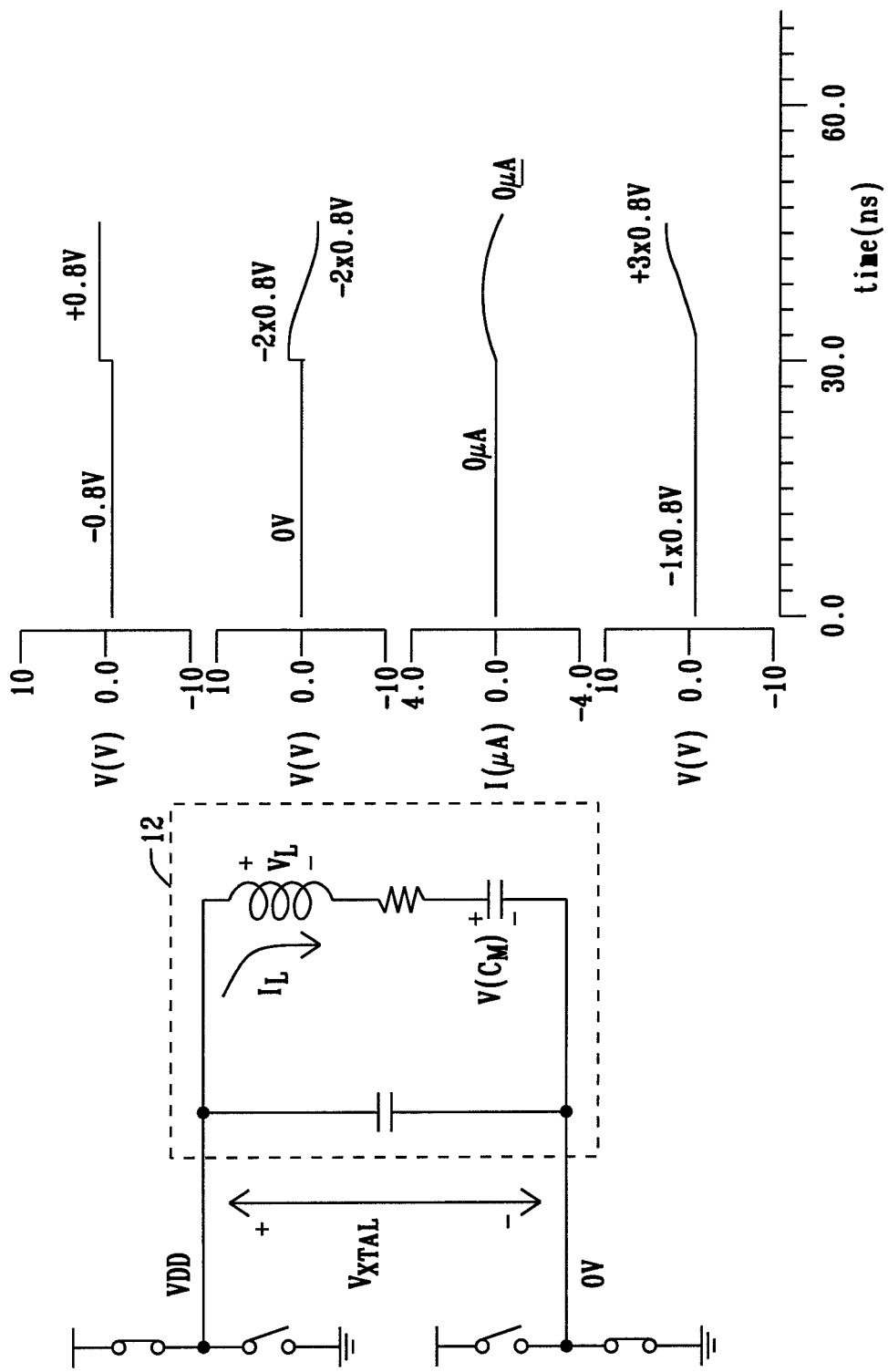
FIG. 2 shows an exemplary oscillator circuit and associated signals during a first voltage step of the start-up phase.

Then a maximum voltage step is applied over the crystal 12 as depicted in FIG. 2. This voltage step of 2×VDD will come over the inductor 122 and will make the inductor current rise. That current will then increase the voltage of the small capacitor 124 in the LRC circuit, which will cause the inductor voltage to decrease and eventually become negative. That will reduce the current and eventually become zero.

Figure 3:
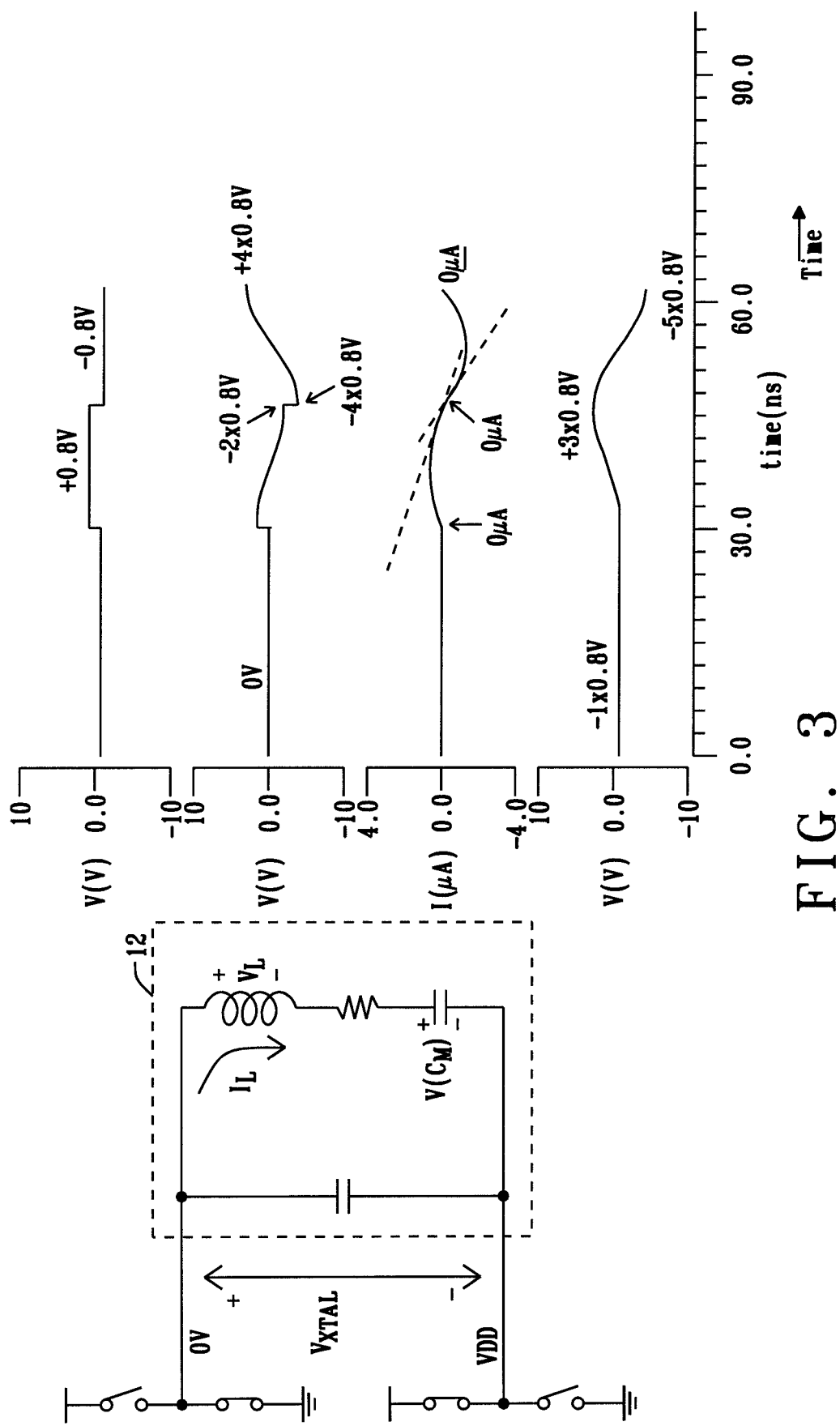
FIG. 3 shows an exemplary oscillator circuit and associated signals with a voltage swap after zero-crossing of the inductor current during the start-up phase.
Figure 4:
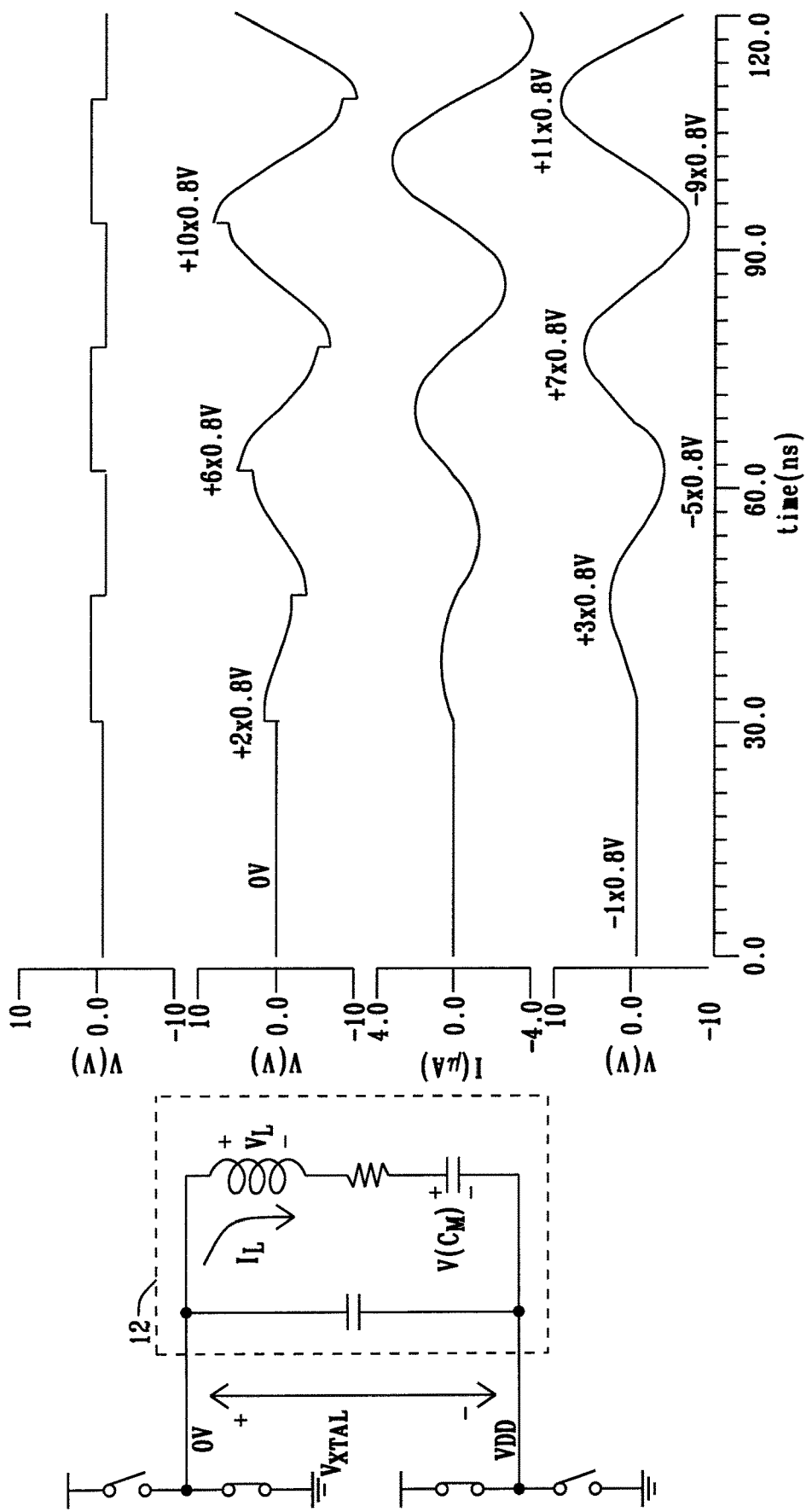
FIG. 4 shows an exemplary oscillator circuit and associated signals during the start-up phase.

If the inductor current becomes negative, we can help the current to become more negative if we make the voltage over the inductor as negative as possible. We can do that by swapping the crystal voltage and make it minus VDD as depicted in FIG. 3. The voltage over the inductor will now become −4×VDD (instead of −2×VDD) and the current will drop twice as fast. The same oscillation will happen and eventually the current will be zero again. At the next zero crossing of the current, we again swap the input voltage, and so on. We can see that the amplitude over the capacitor in the LRC-circuit grows linear with 4×VDD per period, storing energy in the LRC circuit. If we disconnect or neglect the load capacitor and consider ideal switches, we have optimal efficiency. All energy goes into the crystal, and—except for losses in the resistor of the LRC circuit—all energy is actually stored in the LRC circuit.

One difficulty is finding the correct switching moment, which is when the current in the inductor is zero. This is especially difficult after the first half period, since the signal is very small at that time.

Figure 5:
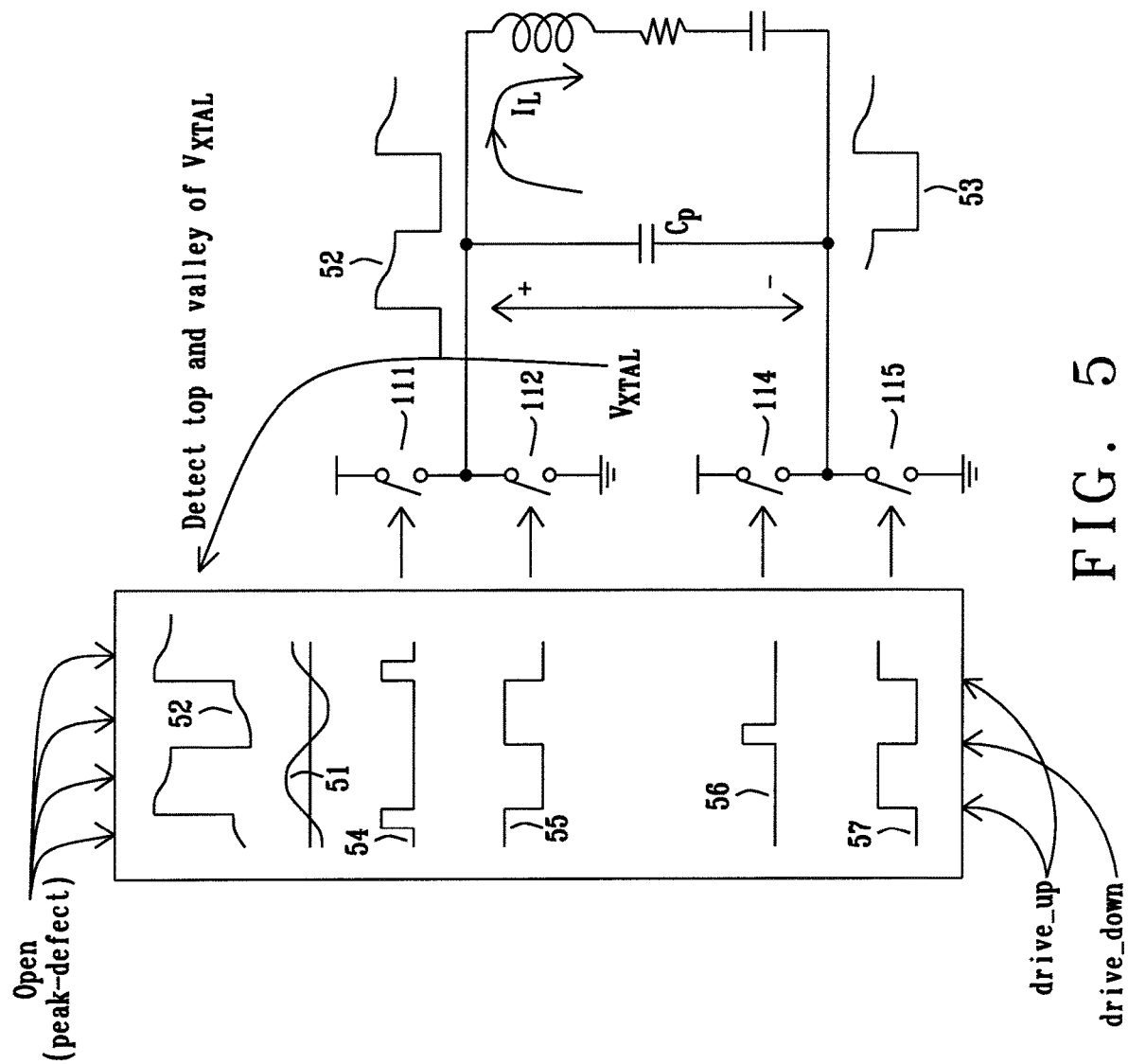
FIG. 5 shows an exemplary oscillator circuit.

FIG. 5 shows an exemplary oscillator circuit and associated signals. In FIG. 5, the current within the crystal illustrated using reference numeral 51, whereas the voltages over the crystal are denoted using reference numerals 52 and 53. Moreover, control signal 54, 55, 56, and 57 are illustrated, wherein said control signals are used to control the switching behavior of the switches 111, 112, 114, and 115. The moment of switching is defined by looking at the top and valley of the crystal voltage on $V_{XTAL}$. This is done by a differentiator circuit and is explained later. If a top is detected, the second ground switch is closed, and the first supply switch is closed. This will make the crystal voltage $V_{XTAL}$ equal to +VDD. The first supply switch is however only closed for a short time and then opened. This makes it possible that the inductor current can only flow through the parasitic capacitor $C_p$ and creates a voltage equal to the integrated inductor current. When the crystal voltage $V_{XTAL}$ is at its lowest point (the valley, dV/dt=0), this is an indication that the current is zero and that the voltage over the crystal should be swapped. If a valley is detected, the first ground switch is closed, together with the second supply switch. The second supply switch will be opened after a short time to be able to detect the top.

One advantage of this approach is that e.g. no trimmed RC oscillator is required. This simplifies the circuit and reduces trimming effort. Another advantage of this approach is that the signal to measure is much larger because the respective supply switch is open during the measurement and the amplitude is only determined by the parasitic capacitance $C_p$. In particular, the signal amplitude does not depend on the on-resistance of the switch, which has to be significantly lower in impedance than the parasitic capacitance in order not to get an extra phase-shift. This will make the circuit much more robust and simplifies the design.

Figure 6:
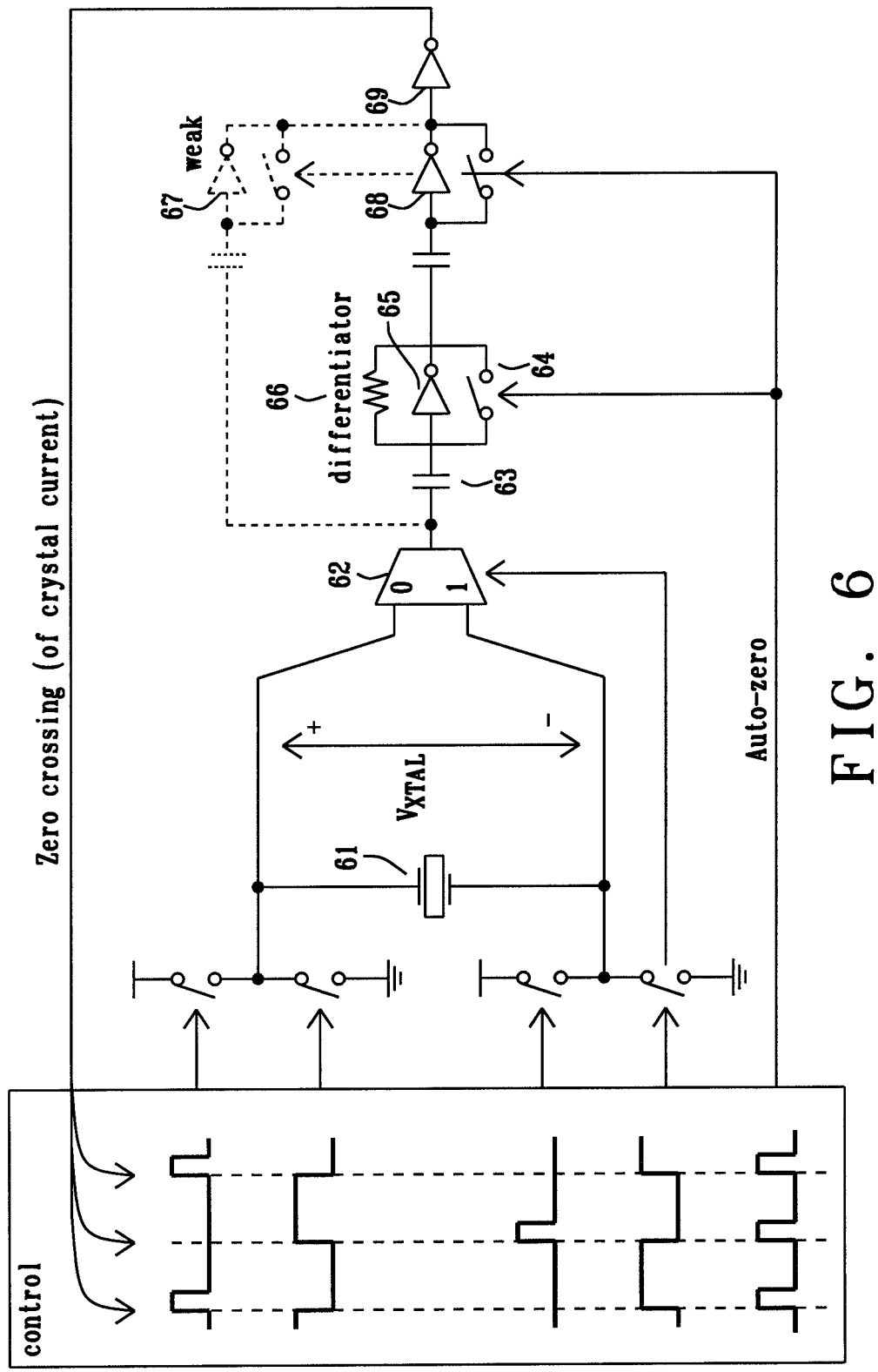
FIG. 6 shows an exemplary oscillator circuit with an extreme value detection unit.

FIG. 6 shows an exemplary oscillator circuit with an exemplary extreme value detection unit, wherein a differentiator forms the core of said extreme value detection unit. The differentiator is made of an inverter 65, a resistor 66, a capacitor 63 and a switch 64 (auto-zero switch). The switch 64 is closed before the differentiator is used and will auto-zero the inverter 65. The inverter 64 will then act as an inverting amplifier, with a virtual ground at its input. If the signal is rising, a current will flow into the capacitor 63 and through the resistor 66. The output voltage will be proportional to –dV/dt. The next stage is an auto-zero-ed inverter, acting as an inverting amplifier. Note that there is a second (much weaker) amplifier 67 shown in FIG. 10. This is optional but can compensate for non-idealities of the differentiator. For example, it will compensate for unwanted extra phase-shifts. Finally, there may be extra inverters 68 and 69 to provide even more gain and make the resulting signal an improved digital signal. Each rising edge of the resulting signal indicates a peak or a valley. At the input of the differentiator, a multiplexer 62 is configured to forward either the voltage at the first electrode of the crystal 61 or the voltage at the second electrode of the crystal 61 to capacitor 63.

As can be seen in FIG. 6, the required circuits are all very simple and very suitable to integrate in an advanced technology, optimized for digital circuits. No bias current or trimming is needed, and offset is cancelled by auto-zeroing with minimal overhead.

Figure 7:
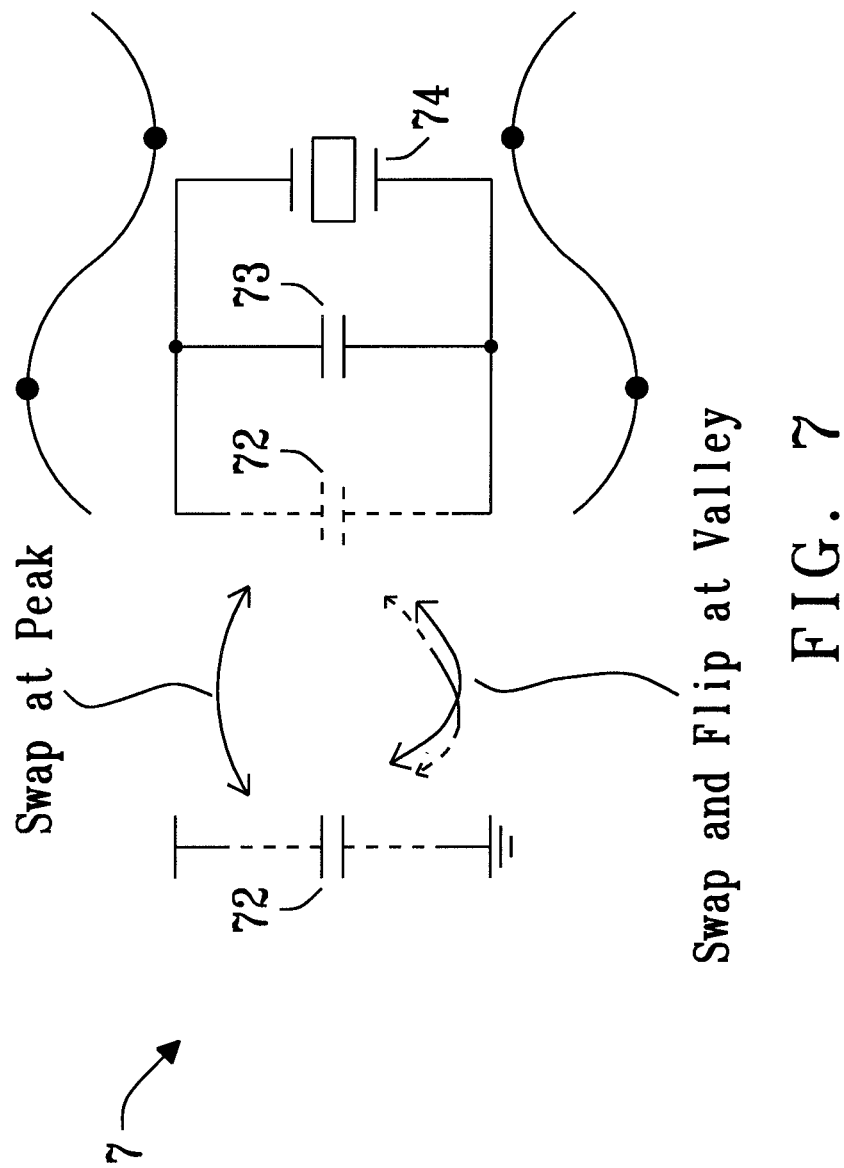
FIG. 7 shows an exemplary oscillator circuit in a steady-state phase.

FIG. 7 shows an exemplary oscillator circuit in a steady-state phase. In particular, FIG. 7 shows an exemplary switched capacitor oscillator 7 with a single capacitive element 72. The switched capacitor oscillator 7 comprises a crystal 74 configured to generate an oscillating voltage signal, a load capacitor 73 coupled to the crystal 74, and a capacitive element 72. The switched capacitor oscillator 7 also comprises a switching circuit which is not explicitly illustrated in FIG. 7. Instead, the switching circuit is implicitly illustrated in FIG. 7 with the help of various arrows. The switching circuit may be configured to alternately connect the capacitive element 72 to the load capacitor 73, and to disconnect the capacitive element 72 from the load capacitor 73.

The following figures show examples of extreme value detection units which may be used both in the start-up phase or the steady-state phase of an oscillator circuit.

Figure 8:
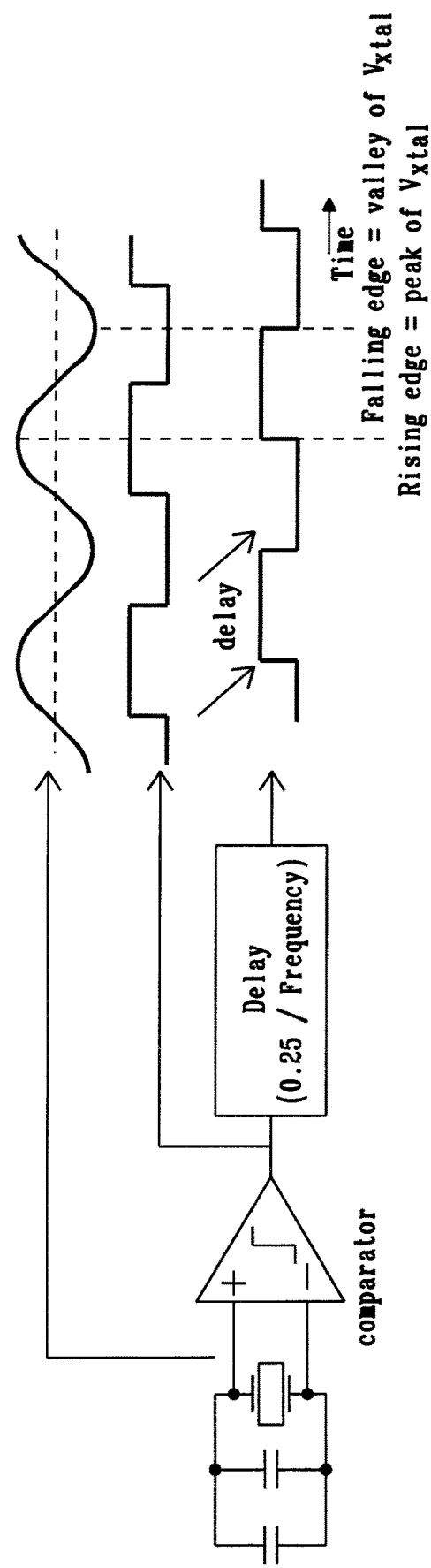
FIG. 8 shows another example of an extreme value detection unit.

One way to detect peaks and valleys is to add a delay of 25% of a typical period to the zero-crossing of the voltage $V_{XTAL}$. FIG. 8 shows an example of an extreme voltage detection unit which is based on this principle. The zero-cross comparator is often implemented anyway to generate a digital clock from the crystal signal, so the comparator doesn't add circuitry. The actual delay is not too critical, exactly 25% is ideal, but the circuit will still work if it is less or more. In theory, it can work between 1% and 49%, but in practice the delay should be between about 15% and 35%.

Figure 9:
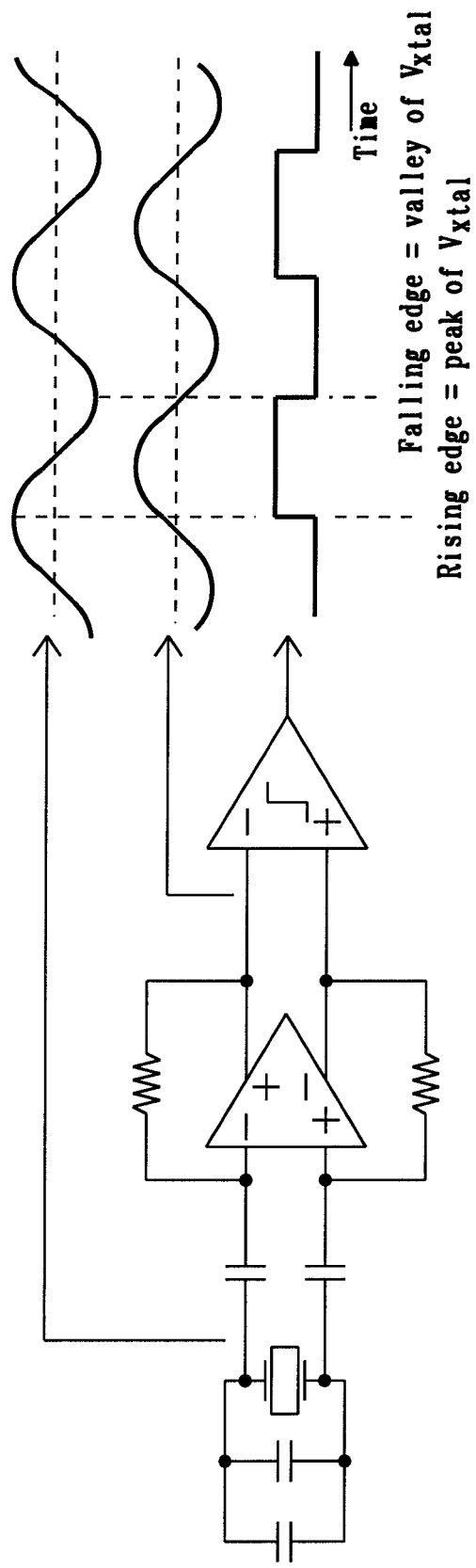
FIG. 9 shows another example of an extreme value detection unit.
Figure 10:
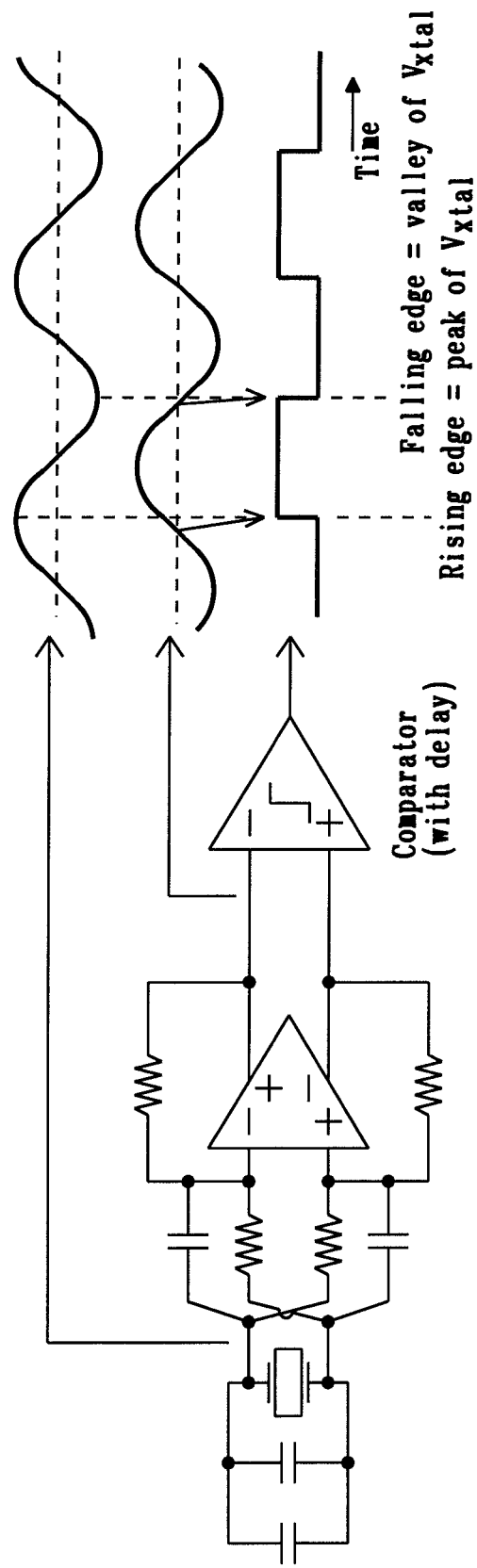
FIG. 10 shows another example of an extreme value detection unit.

Another way to detect peaks and valleys is to differentiate the voltage over the crystal and to detect the zero-crossings of that differentiated signal. FIG. 9 shows a corresponding example of an extreme voltage detection unit. In order to compensate for comparator delay and extra phase-shift due to a non-ideal operation amplifier, two resistors can be added to the circuit of FIG. 9. FIG. 10 shows a modified example of an extreme voltage detection unit with two additional resistors. With proper values for the extra resistors, the comparator output can be aligned exactly to the peaks/valleys of the crystal voltage $V_{XTAL}$.

Figure 11:
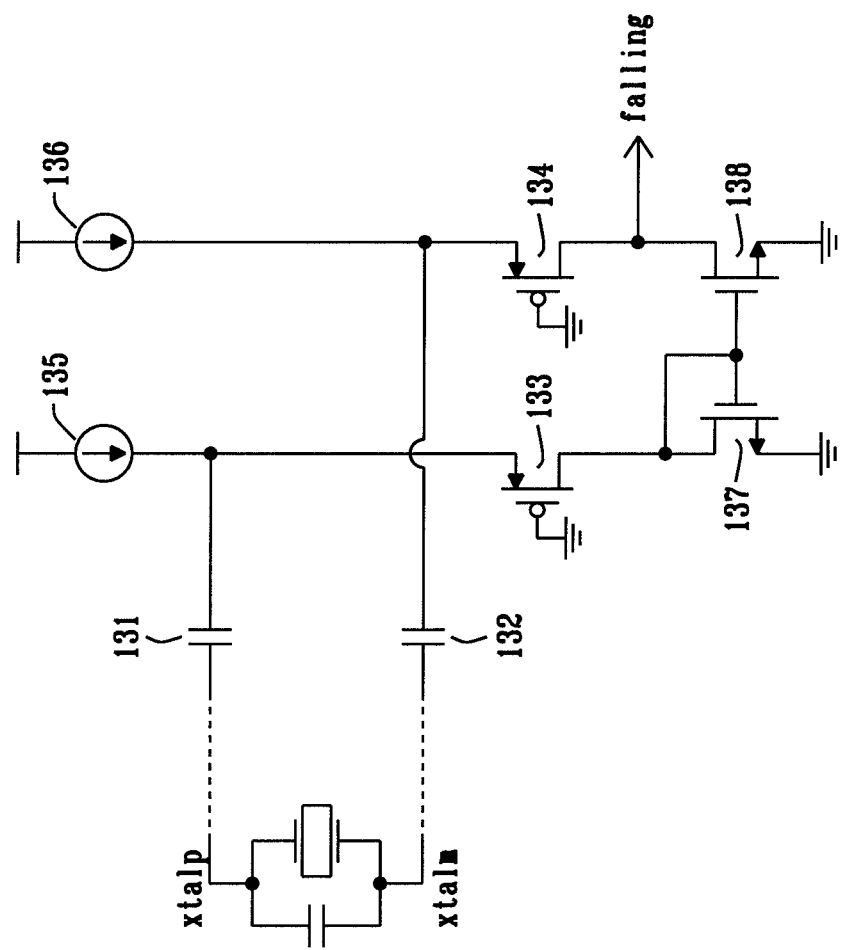
FIG. 11 shows another example of an extreme value detection unit.

FIG. 11 shows another example of an extreme voltage detection unit. The example comprises two current sources 135, 136 and two transistors 137, 138 forming a current mirror. The two capacitors 131, 132 act as differentiators. The two transistors 133, 134 create low-ohmic nodes for the capacitors 131, 132. The extreme voltage detection unit of FIG. 11 may also comprise an additional reset switch (not shown in FIG. 11) coupled between the sources of transistors 133, 134. The reset switch may be configured to, during the start-up phase, connect the sources of transistors 133, 134 during times when the supply terminal of the power source is connected to the crystal (e.g. via a switching circuit described in the present document).

Figure 12:
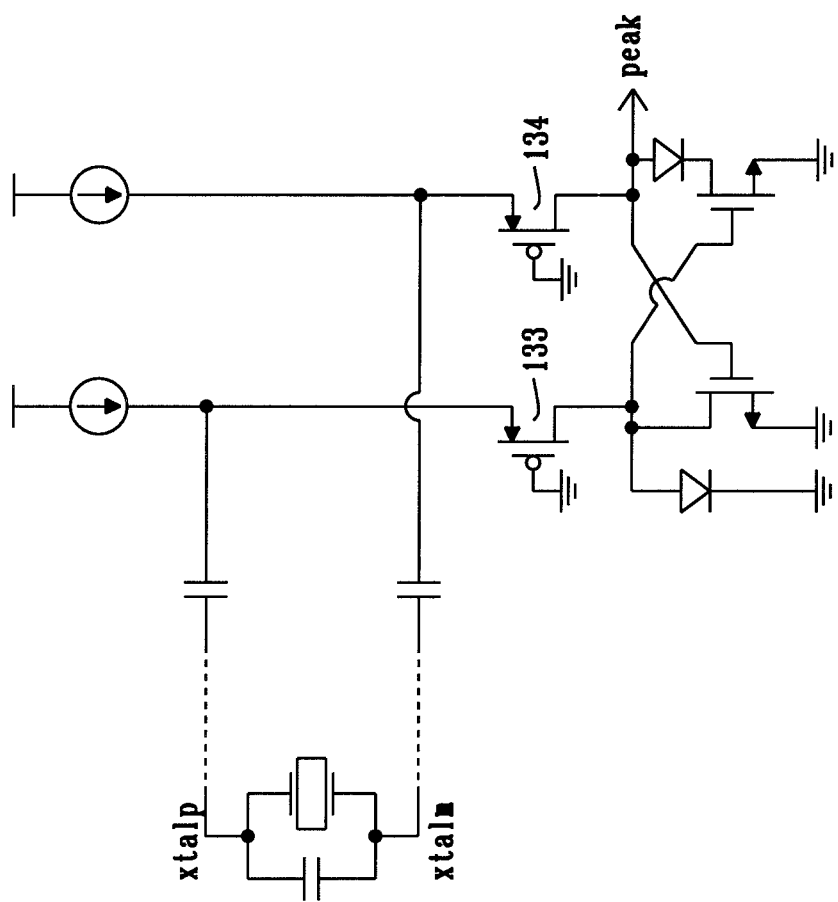
FIG. 12 shows another example of an extreme value detection unit.
Figure 13:
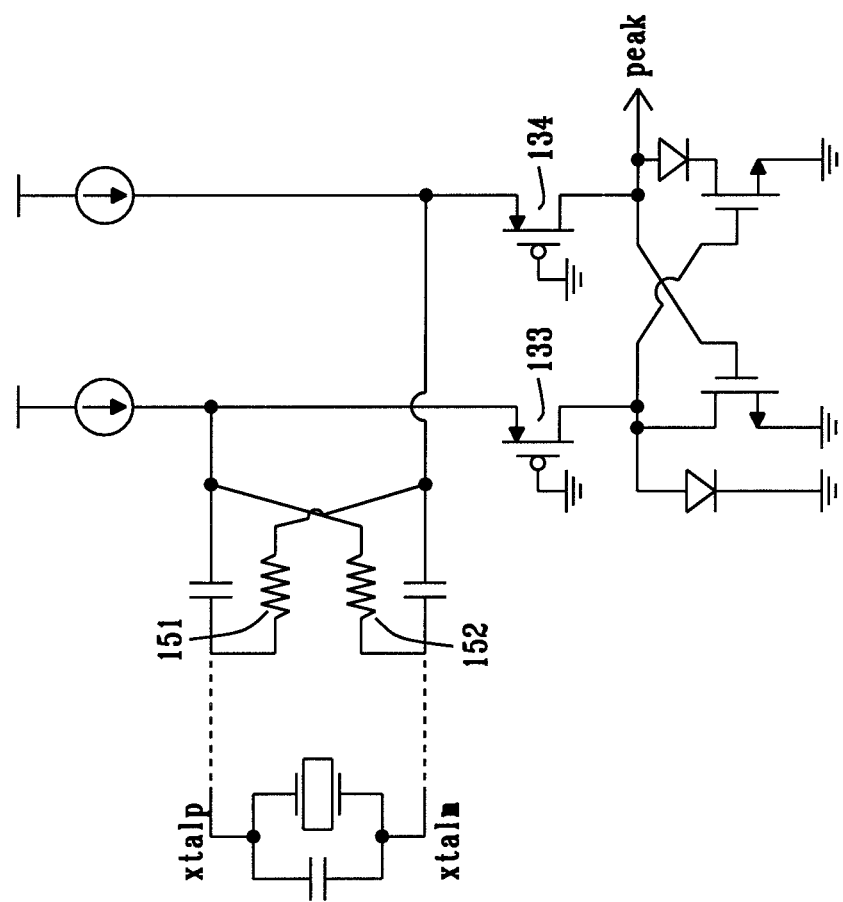
FIG. 13 shows another example of an extreme value detection unit.

FIG. 12 shows yet another example of an extreme voltage detection unit. In FIG. 12, the current mirror is replaced by a latch in order to improve the speed of the comparator. Finally, FIG. 13 shows a further example of an extreme voltage detection unit. Again, the extreme voltage detection unit of FIG. 12 may also comprise an additional reset switch (not shown) coupled between the sources of transistors 133, 134. The reset switch may be configured to, during the start-up phase, connect the sources of transistors 133, 134 during times when the supply terminal of the power source is connected to the crystal (i.e. when energy is added to the crystal). FIG. 13 shows an improved version of the extreme voltage detection unit of FIG. 12, wherein two cross-connected resistors 151, 152 are added.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:
1. An oscillator circuit comprising
   a crystal configured to generate an oscillating voltage signal, wherein said crystal comprises a first electrode and a second electrode,
   a power source comprising a supply terminal and a reference terminal, and a switching circuit arranged between the power source and the crystal, wherein the switching circuit is configured to, in a start-up phase, alternately connect the supply terminal of the power source to the first and second electrode of the crystal such that an amplitude of the oscillating voltage signal is increased;

wherein the oscillator circuit comprises an extreme voltage detection unit configured to:
- determine a differentiated signal be differentiating the oscillating voltage signal and
- detect a zero-crossing of the differentiated signal.

2. The oscillator circuit of claim 1, wherein the switching circuit is configured to, in the start-up phase, alternately connect the supply terminal of the power source to the first and second electrode of the crystal
- such that the oscillating voltage signal is temporarily increased when the oscillating voltage signal has a maximum voltage value or when the oscillating voltage signal is decreasing, or
- such that the oscillating voltage signal is temporarily decreased when the oscillating voltage signal has a minimum voltage value or when the oscillating voltage signal is increasing.

3. The oscillator circuit of claim 1, wherein the switching circuit comprises
- a first supply switch coupled between the supply terminal of the power source and the first electrode of the crystal,
- a first ground switch coupled between the reference terminal of the power source and the first electrode of the crystal,
- a second supply switch coupled between the supply terminal of the power source and the second electrode of the crystal, and
- a second ground switch coupled between the reference terminal of the power source and the second electrode of the crystal.

4. The oscillator circuit of claim 1, wherein the extreme voltage detection unit is configured to detect
- a first time instance at which the oscillating voltage signal reaches a maximum voltage value, or
- a second time instance at which the oscillating voltage signal reaches a minimum voltage value.

5. The oscillator circuit of claim 4, wherein the switching circuit is configured to
- at or after the first time instance, connect the supply terminal of the power source to the first electrode of the crystal, or
- at or after the second time instance, connect the supply terminal of the power source to the second electrode of the crystal.

6. The oscillator circuit of claim 5, wherein the switching circuit is configured to,
- after connecting the supply terminal of the power source to the first electrode of the crystal and before the extreme voltage detection unit detects the second time instance, disconnect the supply terminal of the power source from the first electrode of the crystal, or
- after connecting the supply terminal of the power source to the second electrode of the crystal and before the extreme voltage detection unit detects the first time instance, disconnect the supply terminal of the power source from the second electrode of the crystal.

7. The oscillator circuit of claim 1, further comprising a load capacitor and a capacitive element, wherein the switching circuit is configured to, in a steady-state phase,
- couple the load capacitor to the crystal, and
- alternately connect and disconnect said capacitive element to and from the load capacitor such that the oscillating voltage signal continues oscillating with a given amplitude.

8. The oscillator circuit of claim 7, wherein the switching circuit is configured to, after disconnecting the capacitive element from the load capacitor,
- connect the capacitive element to the power source for charging the capacitive element.

9. The oscillator circuit of claim 7, wherein the switching circuit is configured to
- disconnect the capacitive element from the power source before connecting the capacitive element to the load capacitor.

10. The oscillator circuit of claim 7, wherein the oscillator circuit is configured to, in the steady-state phase, charge the capacitive element and connect the capacitive element to the load capacitor such that
- the oscillating voltage signal is temporarily increased when the oscillating voltage signal has a maximum voltage value or when the oscillating voltage signal is decreasing, or
- the oscillating voltage signal is temporarily decreased when the oscillating voltage signal has a minimum voltage value or when the oscillating voltage signal is increasing.

11. The oscillator circuit of claim 4, wherein the extreme voltage detection unit comprises
- a capacitor coupled either to the first electrode or the second electrode of the crystal,
- an inverting amplifier coupled between the capacitor and an output of the extreme voltage detection unit, and
- a resistor coupled in parallel to the inverting amplifier.

12. The oscillator circuit of claim 11, wherein the extreme voltage detection unit comprises an auto-zero switch coupled in parallel to the inverting amplifier, wherein the oscillator circuit is configured to
- initialize the extreme voltage detection unit by closing the auto-zero switch for a period of time, and then
- open the auto-zero switch again.

13. A method of operating an oscillator circuit, wherein the oscillator circuit comprises
- a crystal for generating an oscillating voltage signal, wherein said crystal comprises a first electrode and a second electrode,
- a power source comprising a supply terminal and a reference terminal, and
- a switching circuit arranged between the power source and the crystal, wherein the method comprises, in a start-up phase,
- alternately connecting the supply terminal of the power source to the first and second electrode of the crystal such that an amplitude of the oscillating voltage signal is increased;

wherein the oscillator circuit comprises an extreme voltage detection unit comprising
- a capacitor coupled either to the first electrode or the second electrode of the crystal,
- an inverting amplifier coupled between the capacitor and an output of the extreme voltage detection unit, and
- a resistor coupled in parallel to the inverting amplifier.

14. The method of claim 13, comprising, in the start-up phase, by the switching circuit, alternately connecting the supply terminal of the power source to the first and second electrode of the crystal such that the oscillating voltage signal is temporarily increased when the oscillating voltage signal has a maximum voltage value or when the oscillating voltage signal is decreasing, or such that the oscillating voltage signal is temporarily decreased when the oscillating voltage signal has a minimum voltage value or when the oscillating voltage signal is increasing.

15. The method of claim 13, wherein the switching circuit comprises
   a first supply switch coupled between the supply terminal of the power source and the first electrode of the crystal,
   a first ground switch coupled between the reference terminal of the power source and the first electrode of the crystal,
   a second supply switch coupled between the supply terminal of the power source and the second electrode of the crystal, and
   a second ground switch coupled between the reference terminal of the power source and the second electrode of the crystal.

16. The method of claim 13, comprising detecting, by the extreme voltage detection unit,
   a first time instance at which the oscillating voltage signal reaches a maximum voltage value, or
   a second time instance at which the oscillating voltage signal reaches a minimum voltage value.

17. The method of claim 16, comprising
   connecting, at or after the first time instance, the supply terminal of the power source to the first electrode of the crystal, or
   connecting, at or after the second time instance, the supply terminal of the power source to the second electrode of the crystal.

18. The method of claim 17, comprising
   disconnecting, after connecting the supply terminal of the power source to the first electrode of the crystal and before the extreme voltage detection unit detects the second time instance, the supply terminal of the power source from the first electrode of the crystal, or
   disconnecting, after connecting the supply terminal of the power source to the second electrode of the crystal and before the extreme voltage detection unit detects the first time instance, the supply terminal of the power source from the second electrode of the crystal.

19. The method of claim 13, wherein the oscillator circuit comprises a load capacitor and a capacitive element, wherein the method comprises
   coupling, in a steady-state phase, the load capacitor to the crystal, and
   alternately connecting and disconnecting, in the steady-state phase, said capacitive element to and from the load capacitor such that the oscillating voltage signal continues oscillating with a given amplitude.

20. The method of claim 19, comprising, after disconnecting the capacitive element from the load capacitor,
   connecting the capacitive element to the power source for charging the capacitive element.

21. The method of claim 19, comprising
   disconnecting the capacitive element from the power source before connecting the capacitive element to the load capacitor.

22. The method of claim 19, comprising charging, in the steady-state phase, the capacitive element and connecting the capacitive element to the load capacitor such that
   the oscillating voltage signal is temporarily increased when the oscillating voltage signal has a maximum voltage value or when the oscillating voltage signal is decreasing, or
   the oscillating voltage signal is temporarily decreased when the oscillating voltage signal has a minimum voltage value or when the oscillating voltage signal is increasing.

23. The method of claim 13, wherein the extreme voltage detection unit comprises an auto-zero switch coupled in parallel to the inverting amplifier, and wherein the method comprises
   initializing the extreme voltage detection unit by closing the auto-zero switch for a period of time, and then
   opening the auto-zero switch again.

24. A method of operating an oscillator circuit, wherein the oscillator circuit comprises
   a crystal for generating an oscillating voltage signal, wherein said crystal comprises a first electrode and a second electrode,
   a power source comprising a supply terminal and a reference terminal, and
   a switching circuit arranged between the power source and the crystal,
wherein the method comprises, in a start-up phase,
   alternately connecting the supply terminal of the power source to the first and second electrode of the crystal such that an amplitude of the oscillating voltage signal is increased;
wherein the method comprises
   determining, by an extreme voltage detection unit, a differentiated signal by differentiating the oscillating voltage signal, and
   detecting, by the extreme voltage detection unit, a zero-crossing of the differentiated signal.

* * * * *